United States Patent [19]

Readhead

[11] Patent Number: 4,555,720
[45] Date of Patent: Nov. 26, 1985

[54] INFRA-RED RADIATION DETECTORS AND THEIR MANUFACTURE

[75] Inventor: John B. Readhead, Lyndhurst, England

[73] Assignee: U.S. Philips Corporation, New York, N.Y.

[21] Appl. No.: 463,210

[22] Filed: Feb. 2, 1983

[30] Foreign Application Priority Data

Mar. 3, 1982 [GB] United Kingdom ............. 8206290

[51] Int. Cl.⁴ .................. H01L 27/14; H01L 27/12
[52] U.S. Cl. ................................. 357/30; 357/49; 357/4
[58] Field of Search ............... 357/30, 30 D, 49, 4

[56] References Cited

U.S. PATENT DOCUMENTS

| | | | |
|---|---|---|---|
| 3,987,298 | 10/1976 | Rotoiante | 357/30 |
| 4,206,470 | 6/1980 | White | 357/30 |
| 4,310,583 | 1/1982 | Baker et al. | 428/209 |
| 4,321,615 | 3/1982 | Blackman et al. | 357/30 |

FOREIGN PATENT DOCUMENTS 57-10983  1/1982  Japan .

OTHER PUBLICATIONS

Halpert, H. et al., "N-Color (Hg,Cd)Te Photodetectors," *Applied Optics*, vol. 11, No. 10, pp. 2157-2161, (Oct. 1972).

Primary Examiner—Martin H. Edlow
Assistant Examiner—Terri M. Henn
Attorney, Agent, or Firm—Marc D. Schechter

[57] ABSTRACT

A multicolor or other multilevel infrared detector comprises at least one first detector element formed in a first portion of a lower body, e.g. of cadmium mercury telluride. At least one second detector element, having different detector characteristics, is formed in an upper body, e.g. of cadmium mercury telluride. The lower body is divided, preferably by ion etching into at least two (and more usually three or more) portions separated from each other by gaps. The gaps in the lower body are bridged by the upper body. Electrical connections to the second detector elements comprises the separate portions of the lower body. The electrical connections include metallization layers extending from the top to the substrate on which the lower body is mounted. The substrate may be of insulating material, e.g. sapphire, or it may be for example a silicon CCD for processing signals from the detector elements.

12 Claims, 5 Drawing Figures

INFRA-RED RADIATION DETECTORS AND THEIR MANUFACTURE

BACKGROUND OF THE INVENTION

This invention relates to infrared radiation detectors, particularly, but not exclusively, to so-called multicolor detectors. Multicolor detectors measure different wavelengths emitted by a broadband source of infrared radiation. Such multicolor detectors permit, for example, measurement of the temperature of the radiation source independent of the emissivity of the source and the transmission of the space between the source and the detector. The detector may comprise either single detector elements or arrays of detector elements. The detector elements may be photoconductive or photovoltaic.

The invention further relates to a method of manufacturing such a detector.

In an article entitled "N-Color (Hg,CD)Te Photodetectors" by H. Halpert, et al (Applied Optics, Vol. 11, No. 10, October 1972, pages 2157 to 2161), infrared radiation detectors are described. Each detector comprises at least one first detector element and at least one second detector element. The first detector element is formed in a lower body of infrared sensitive material mounted on a substrate. The second detector element, which has different detector characteristics from those of the first detector element, is formed in an upper body of infrared sensitive material mounted on the lower body. Electrical connections are made to the detector elements of the upper and lower bodies. One of the first and second detector elements is positioned to receive infrared radiation transmitted by the other of the detector elements.

As illustrated in FIGS. 3 to 5 of the Halpert, et al article, the material of the lower body has a longer cutoff wavelength than that of the upper body. The lower first detector element therefore senses long wavelength radiation transmitted by the upper body. The electrical connections in these known detectors are made by bonding wires to indium contact metallizations actually on the detector element bodies themselves. Particularly with detector elements of cadmium mercury telluride, the bonding of these wire connections to metallizations on the infrared sensitive material can result in strain and damage to the infrared sensitive material. Such strain and damage degrade the performance of the detector elements by, for example, increasing charge carrier recombination. In extreme cases fracturing of the infrared sensitive material may even occur. It is also inconvenient and difficult to carefully bond these wire connections at the different levels of the upper and lower body surfaces.

Similar connection problems can arise not only in multicolor detectors but in any other type of infrared detector having stacked detector element bodies. One such other type of detector is described in U.S. Pat. No. 3,987,298 (Rotolante). In this patent, the first and second detector elements have the same cutoff wavelength, but the upper detector element body is thinner and transmits some proportion of the radiation to the lower detector element body. In the embodiment shown in FIG. 2 of U.S. Pat. No. 3,987,298, the first detector element has metallizations which extend onto the substrate where the wire connections are made. The upper body is separated from the lower body by a layer of transparent insulator such as epoxy which also covers part of the metallization on the substrate. The detector element of the upper body has metallizations which extend onto the insulator layer where the wire connections are made to the second detector element.

However this structure places conflicting requirements on the thickness of the intermediate insulator layer. On the one hand, this insulator layer generally should be very thin between the upper and lower bodies so as to reduce strain in the detector element bodies and to increase thermal conductance and infrared radiation transmission between the bodies. On the other hand, a very thin insulator layer between the metallization of the first and second detector elements may result in short-circuiting of the two levels of metallization as a result of pin holes in the insulator or damage to the insulator when bonding wires to the upper level metallization.

In the structure illustrated in FIG. 2 of U.S. Pat. No. 3,987,298, the insulator layer shown (as indicated by reference numeral 26) combines both undesirable features discussed above. The layer is undesirably thicker between the bodies (reference numerals A and B) and thinner between the two levels of metallization (reference numerals 22, 28, 24, and 30). Furthermore, this structure does not eliminate the problem of bonding wires at two different levels.

U.S. Pat. No. 4,206,470 (White) discloses a modified insulated electrical connection structure for multicolor, stacked infrared detector element array bodies. The detector array is mounted on a signal processing silicon CCD substrate in a focal plane imaging arrangement. In this detector arrangement, as illustrated in FIG. 2 of U.S. Pat. No. 4,206,470, gold or nickel first-level contact pads (such as reference numerals 134a, 134b and 134c) are plated up to extend upward from the substrate to at least the height of the top surface of the lower detector element body. The gaps between the body and the individual contact pads are back filled with an inert insulating material such as epoxy. The epoxy must then be mechanically lapped down to form exposed contact pads at an essentially coplanar surface with the remaining epoxy and with the top surface of the lower detector element body. Then, thin film metal interconnects are deposited on the coplanar surface to form the connections for the lower array of first detector elements.

The upper detector element body is then mounted on the lower body, and the whole sequence of plating contact pads, back filling with epoxy, mechanically lapping, and depositing thin film metal interconnects is repeated to form the connections for the upper array of second detector elements.

Such a manner of providing the connections for second detector elements is complex and involves many different processing steps. The processing steps are labor-intensive and can reduce the yield of detectors manufactured with satisfactory performance. Thus, for example, the very thick back filling with epoxy and the mechanical lapping can strain and damage the infrared sensitive material, increasing charge carrier recombination. The problems are particularly acute with a material such as cadmium mercury telluride.

SUMMARY OF THE INVENTION

According to a first aspect of the present invention, an infrared radiation detector comprises at least one first detector element which is formed in a lower body of infrared sensitive material mounted on a substrate. At least one second detector element, which has different detector characteristics from those of the first detector element, is formed in an upper body of infrared sensitive material mounted on the lower body. Electrical connections to the detector elements of the upper and lower bodies are provided. One of the first and second detector elements is positioned to receive infrared radiation transmitted by the other detector element. According to the invention, the lower body is divided into at least two portions separated from each other by a gap. The upper body bridges the gap between the two portions of the lower body. The first detector element is formed in a first of the two portions of the lower body, and the second detector element has an electrical connection which is the second of the two portions of the lower body.

By adopting such a detector structure according to the invention, the electrical connections to the second detector element (or elements) of the upper body can be formed in a comparatively simple yet reliable manner without degrading the performance of the detector elements in the lower and upper bodies. There is no need to use many different damaging and strain-inducing processing steps, so that the yields of detectors manufactured with satisfactory performance can be high, even with detector elements of cadmium mercury telluride. A thick epoxy or other thick insulating layer is not needed, either for back-filling or as an intermediate insulating layer between two levels of metallization.

The gap which separates the first and second portions of the lower body can be formed readily after mounting the lower body on the substrate. The gap can be formed in the same processing steps as may be used to shape the detector element body or (in the case of an array) to divide the body into an array of detector element body portions. These first and second portions of the lower body can thus provide in a simple manner a substantially coplanar surface so as to reliably support the upper body without inducing any significant strain affecting the detector element performance.

Preferably the second of the two portions of the lower body has a metallization which is associated with the second detector element. This metallization extends at least on a top face of the second portion, and may also extend over a side face of the second portion and onto the substrate. Preferably the second detector element has a metallization connection from the upper body to the metallization at the top face of the second of the two portions of the lower body. The upper body which bridges the gap carries the metallization connection to the top face of the second portion of the lower body. The second portion of the lower body serves as a supporting step which can carry the metallization connection to the substrate. Thus, there is no need to use thick metallization for this connection, and since the metallization connection from the upper second detector element can be provided in two process steps (one for metallization of the lower body, and the other for metallization of the upper body) standard metal deposition techniques can be used to obtain good metal coverage of the structural steps occurring at the side faces of the upper and lower bodies.

Preferably the first detector element has electrical connections formed by metallizations extending to the substrate from the first portion of the lower body. Such metallization connections of the first detector element may extend over a side face of the first portion of the lower body and can be provided in the same process steps as the metallizations on the second portion of the lower body. Thus, both the first and second detector elements can be contacted in a reliable manner at the level of the substrate by wire bonding or otherwise, without degrading the detector element characteristics. When the substrate comprises signal processing circuitry, the metallization connections of both the first and second detector elements may be connected directly to the contacts of the substrate circuitry.

The second portion of the lower body may carry more than one electrical connection for the upper second detector element. In that case, however, separate metallization patterns for each connection must be defined on the second portion of the lower body. This can complicate the manufacture of the detector, particularly in respect of the geometry and alignment when forming arrays of detector elements in each of the upper and lower bodies.

In a preferred form of the invention, the lower body also comprises a third portion which is separated from the first portion by another gap. This additional gap is also bridged by the upper body. The third portion of the lower body provides support for another electrical connection to the second detector element.

Preferably, the third portion of the lower body has a metallization which forms part of this other electrical connection to the second detector element. The metallization extends at least on a top face of the third portion (and preferably over a side face and onto the substrate). The second detector element also has a metallization connection from the upper body to the metallization at the top face of the third portion of the lower body to form the other electrical connection from the second detector element to the substrate.

This construction permits simplification of the geometry and alignment of the connections during manufacture, because the second and third portions of the lower body may carry single connections formed by metallizations which may cover the whole top face (and a side face) of the individual second and third portions. These metallizations may even be defined in the same processing step as used to form the gaps for separating the second and third portions from the first portion of the lower body.

The invention is particularly useful for forming electrical connections for arrays of detector elements in the upper and lower bodies. Thus, for example, in the case of photoconductive detector elements, the lower body may comprise an array of the first portions each of which comprises a first detector element. In the case of photovoltaic detector elements, the first detector elements may be formed in an array of the first portions or in a common first portion.

Regardless of whether the detector elements are photoconductive or photovoltaic the lower body may further comprise a plurality of mutually separate second portions. The second portions provide individual electrical connections to the second detector elements of the upper array. At least one common third portion provides a common connection to the array of second detector elements. The use of a common third portion facilitates the layout geometry, especially when the second portions are arranged along one side of the array of the first detector elements of the lower body. In this case, the common third portion is located at a transverse side of the array of first detector elements.

A second aspect of the present invention is a method of manufacturing an infrared radiation detector according to the invention. In the method, an undivided lower body of infrared sensitive material is mounted on the substrate. A metallization pattern is provided on the lower body and on the substrate beyond the body. The lower body is then divided into separate portions by ion etching through the thickness of the body to form the gap or gaps in the lower body. Next, the upper body is mounted on the divided lower body and is provided with metallizations to form the electrical connections to the second detector element or elements.

The use of ion etching enables one to obtain very narrow gaps between the separate portions and steep side walls for the portions (due to at most only small lateral etching). Ion etching also defines the metallizations of the separate portions in the same step as that which defines the separate portions of the lower body. This is particularly convenient and advantageous for obtaining very compact structures. Furthermore this method is also compatible with the method of manufacturing arrays of detector elements disclosed in U.S. Pat. No. 4,310,583 (Baker), the whole content of which is hereby incorporated by reference.

DESCRIPTION OF THE PREFERRED EMBODIMENTS

Figure 1:
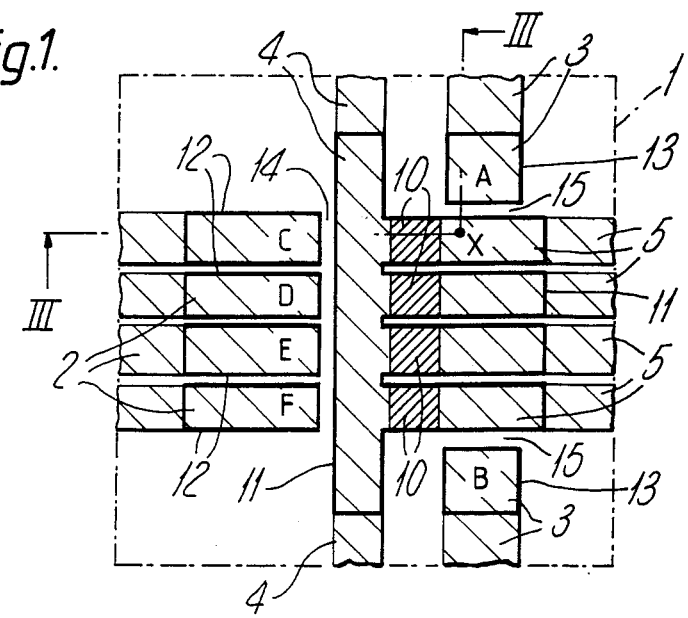
FIG. 1 is a top plan view of part of a substrate with a lower detector element body of an infrared radiation detector according to the invention.

It should be noted that the accompanying drawing is not to scale. The relative dimensions and proportions of some parts of the Figures have been greatly exaggerated or reduced for the sake of clarity and convenience. In particular, in the cross-sectional view of FIG. 3, the real thickness of the various layers in relation to their lateral dimensions is much smaller than illustrated in the drawing.

Figure 2:
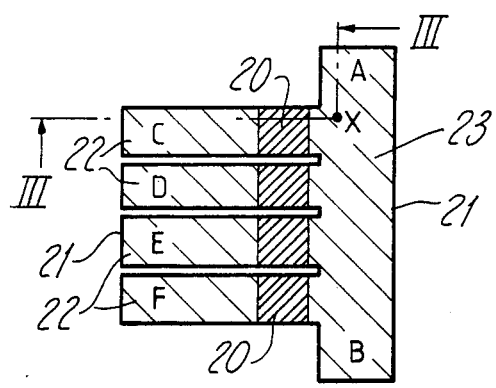
FIG. 2 is a top plan view of an upper detector element body of the detector of which the lower part is illustrated in FIG. 1.
Figure 3:
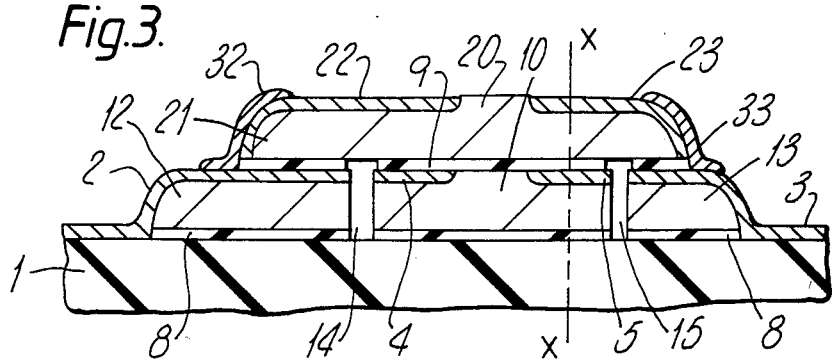
FIG. 3 is a cross-sectional view along the line III—III of FIGS. 1 and 2 of the detector of FIGS. 1 and 2.

The infrared radiation detector of FIGS. 1 to 3 comprises an upper detector element body 21 mounted on a lower detector element body 11, 12, 13 which is itself mounted on a substrate 1. The substrate 1 may be of, for example, optically-polished sapphire.

The lower body 11, 12, 13 is made of infrared sensitive material (preferably cadmium mercury telluride) and is secured to the substrate 1 by, for example, a thin layer 8 of insulating epoxy adhesive. Likewise, the upper body 21 is made of infrared sensitive material (preferably cadmium mercury telluride) and is secured to the lower body 11, 12, 13 by, for example, another thin layer 9 of insulating epoxy adhesive.

First infrared radiation detector elements, each having an active area 10, are present in the lower body. The upper body 21 comprises second detector elements each having an active area 20. In the specific embodiment illustrated in FIGS. 1 to 3, both the first and second detector elements 10 and 20 are arranged in a linear array of four elements each. Each of the active areas 10 and 20 may be, for example, 50 microns by 50 microns. Each of the first detector elements 10 has electrical connections 4 and 5. Each of the second detector elements 20 has electrical connections 2, 22, 32 and 3, 23, 33.

The positioning of the upper body 21 and each of its detector elements of the lower body 11, 12, 13 is such that an active area 20 overlies each detector element active area 10 of the lower body. This construction is particularly useful for a 2-color detector in which the infrared radiation is incident on the top face of the upper body 21, and in which the material of the upper body 21 has a higher mole ratio of cadmium to mercury than the lower body 11, 12, 13. In this case, the first detector elements 10 sense long wavelength radiation transmitted by the upper body 21.

In a particular example, the detector of FIGS. 1 to 3 may have wavelength characteristics similar to those described in the Halpert, et al article discussed above. Thus, the upper body 21 may be of $Cd_{0.23}Hg_{0.73}Te$ having a cutoff wavelength of approximately 8.8 microns and may be approximately 8 microns thick. The lower body 11, 12, 13 may be of $Cd_{0.21}Hg_{0.79}Te$ having a cutoff wavelength of approximately 11 microns and may also be approximately 8 microns thick. In this particular example the epoxy adhesive layers 8 and 9 may each be only 0.5 microns thick.

The first and second detector elements illustrated in FIGS. 1 to 3 are photoconductive elements of n-type cadmium mercury telluride. The active areas 10 and 20 are formed by the radiation-sensitive areas of cadmium mercury telluride located between the associated spaced electrodes formed by metal layers 4 and 5, and 22 and 23 respectively. Using techniques similar to those described in the previously mentioned U.S. Pat. No. 4,310,583, and as illustrated in FIG. 3 herein, these detector elements may be formed with slightly mesa-shaped active areas 10 and 20. The electrode metallizations 4, 5, 22, and 23 extend over rounded edges of the lower and upper bodies 11, 12, 13, and 21.

Furthermore, although not actually shown in FIG. 3 for the sake of simplicity, the top faces of the active areas 10 and 20 and the whole bottom faces of the lower and upper bodies 11, 12, 13, and 21 will generally be passivated in known manner, for example with an anodic oxide layer. An antireflection coating may also be present over the top face of the upper body 21 and on the lower body portion 11 underneath the epoxy adhesive layer 9.

The manner according to the present invention in which the upper body 21 is mounted on the lower body 11, 12, 13 and in which the electrical connections 2, 22, 32, 3, 23, and 33 are made to the second detector elements 20 will now be described. The lower body is divided by gaps 14 and 15 into separate first, second and third portions 11, 12 and 13 respectively. The first detector elements 10 are formed in the first portion 11 which is comb-shaped. First portion 11 has an array of four teeth which contain the active areas and which are integrally united in by a transverse base portion. The electrode metallizations 4 and 5 extend over rounded edges of the base portion and the teeth, respectively, and onto the substrate 1. Metallizations 4 and 5 form electrical connections on substrate 1 to which wires can be bonded at locations beyond the lower body 11, 12, 13.

There are a plurality of mutually separate second portions 12 which are arranged along one side of the array of first detector elements 10. Second portions 12 are separated from the first portion 11 by the gap 14. Each second portion 12 is associated with an individual electrical connection to a second detector element 20 of the upper body 21.

There are two third portions 13 of the lower body 11, 12, 13. Third portions 13 are located at opposite sides of the array of first detector elements 10 and are separated from the first portion 11 by the gaps 15. The two third portions 13 are associated with a common connection to the array of second detector elements 20.

The upper body 21 is also comb-shaped having an array of four teeth containing the active areas 20. The teeth are integrally united by a transverse base portion. The body 21 is supported by all of the first, second and third separate portions 11, 12 and 13 of the lower body. Body 21 is positioned such that the areas designated C, D, E and F at the ends of the teeth overlie the areas C, D, E and F of the second portions 12 of the lower body. The areas designated A and B at the ends of the base portion of the upper body 21 overlie the areas A and B of the third portions 13 of the lower body 11, 12, 13.

Thus, the upper body 21 bridges the gap 14 to carry the electrode metallization 22 of each second detector element 20 to the top face of the corresponding second portion 12. Upper body 21 also bridges the gaps 15 to carry the common electrode metallization 23 of the array of detector elements 20 to the top faces of the two third portions 13.

An interconnecting metal layer 32 extends from the individual electrode metallization 22 of each detector element 20 of the upper body 21 to metallization 2 at the top face of the corresponding second portion 12. The metallization 2 extends from the top face of the second portion 12, over a side face and onto the substrate 1. Thus, each second portion 12 of the lower body 11, 12, 13 serves as a supporting step which carries the metallization connection 2, 22, 32 from the upper body 21 to the substrate 1. Wires can therefore be bonded easily to the metallization 2 directly on the substrate 1 instead of on the body 21.

Similarly an interconnecting metal layer 33 extends from the common electrode metallization 23 to metallizations 3 which are present at the top faces of the third portions 13. Metallizations 3 extend over side faces of third portions 13 and onto the substrate 1. Thus, the third portions 13 also serve as supporting steps which carry the common metallization 23 from the upper body 21 to the substrate 1 where wires can easily be bonded.

The metallizations 2, 3, 4, 5, 22 and 23 on the bodies 11, 12, 13, and 21 may be gold-chromium layers having thicknesses of approximately 0.5 microns, as described in U.S. Pat. No. 4,310,583. The interconnecting layers 32 and 33 may also be of gold having thicknesses of approximately 0.5 microns. Such layers, 2, 3, 4, 5, 22, 23, 32 and 33 can be formed by standard metal deposition techniques.

Figure 4:
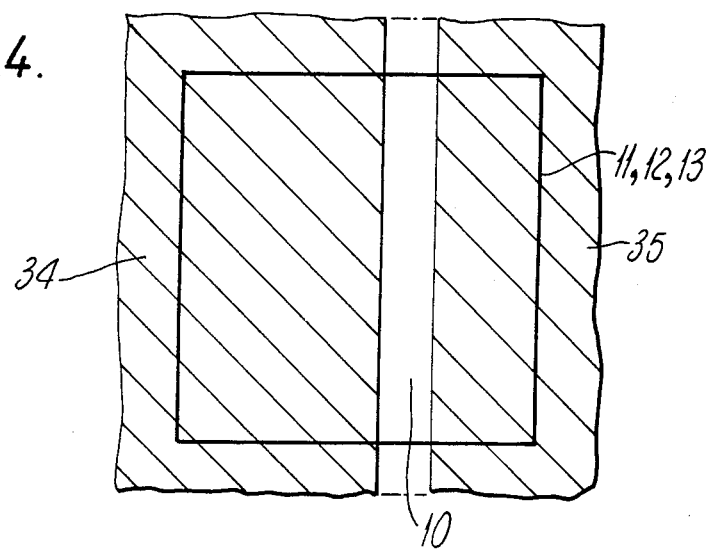
FIGS. 4 and 5 are top plan views of the lower detector part of FIG. 1 at two stages in its manufacture by a method according to the invention.
Figure 5:
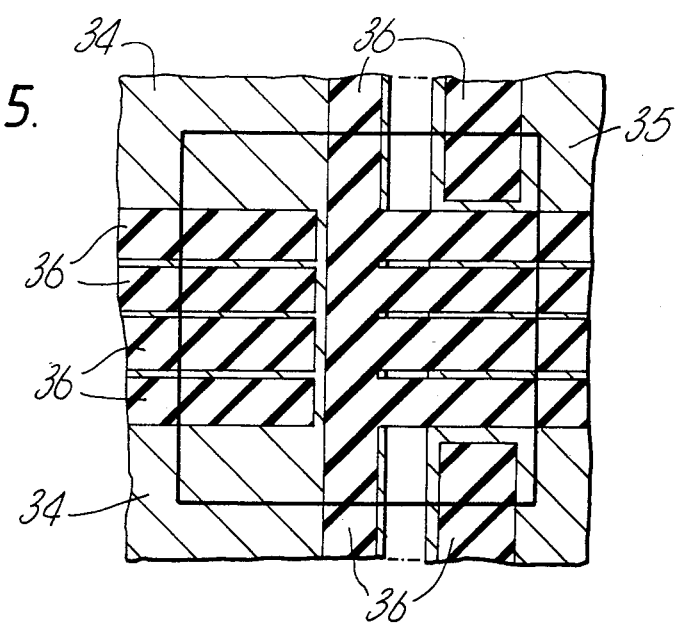

As will now be described with reference to FIGS. 4 and 5, the detector of FIGS. 1 to 3 is preferably manufactured by a method according to the second aspect of the invention which is compatible with the method of manufacturing detector element arrays disclosed in U.S. Pat. No. 4,310,583. In this method, a square or rectangular, undivided lower body 11, 12, 13 having its upper edges rounded at all four sides is mounted on a substrate 1 by an adhesive layer 8. There is then provided on the body 11, 12, 13 and on the substrate 1 beyond the body a metallization pattern 34 and 35. Pattern 34 and 35 consists of separate portions 34 and 35 on opposite sides of a region of the body where the active areas 10 are to be formed (see FIG. 4). The gap separating the two portions 34 and 35 also extends across the substrate 1 beyond the body.

The metallization pattern 34 and 35 can be defined by a photoresist lift-off technique as described in U.S. Pat. No. 4,310,583. Before depositing the metallization, the photoresist stripe can be used as an ion-etching mask for forming the slight mesa shape for the active areas 10.

After forming the metallization pattern 34 and 35, a photoresist mask 36 of more complex geometry (see FIG. 5) is provided. Mask 36 is used for the step of dividing the body 11, 12 and 13 into its separate portions and individual detector elements and dividing the metallization pattern 34 and 35 into the portions 2, 3, 4, and 5.

The body 11, 12, 13 and the metallization pattern 34 and 35 can then be divided simultaneously by ion etching in the manner described in U.S. Pat. No. 4,310,583. The gaps 14 and 15 are formed simultaneously with the parallel slots which extend between the individual active areas 10 of the detector elements.

Thus, the photoresist mask 36 has a comb-shaped portion corresponding to the desired pattern of the first body portion 11 and its metallization connections 4 and 5. Mask 36 has four separate parallel strip portions corresponding to the desired pattern of the second body portions 12 and their metallization 2. Mask 36 has two further portions corresponding to the desired pattern of the third body portions 13 and their metallizations 3. After etching, the photoresist mask 36 is removed.

After the mask 36 is removed, the upper body 21 is mounted on divided lower body portions 11, 12, 13 with the epoxy layer 9. At least the interconnecting metallizations 32 and 33 are then provided to form the electrical connections to the second detector elements 20. Preferably the upper body 21 has been etched into its comb shape and provided with its electrode metallizations 22 and 23 before mounting on the lower body 11, 12, 13. This avoids doing the critical definition stage for the second detector elements on the top of the lower body 11, 12, 13 which would give problems due to the high topography.

Thus, the shaping of the body 21, the provision of its metallizations 22 and 23, and the consequent fabrication of the detector elements 20 is preferably carried out in a manner similar to that described in U.S. Pat. No. 4,310,583. However, the body 21 is present only on a temporary substrate, the metallizations 22 and 23 do not extend on this temporary substrate, and the body 21 with the fabricated detector elements 20 is subsequently detached from the temporary substrate and mounted on the lower body 11, 12, 13 of the detector.

However, if so desired the electrode metallizations 22 and 23 may be provided after mounting the body 21 on the body 11, 12, 13. Metallizations 22 and 23 may then be an integral layer with the interconnecting portions 32 and 33.

Many modifications within the scope of the present invention are of course possible. Although advantageous and convenient, it is not necessary to provide the metallizations 2 and 3 on the second and third portions 12 and 13 of the lower body simultaneously with the electrode metallizations 4 and 5 of the first detector elements 10. Thus, metallizations extending on the rounded edge parts of the top and side faces of the second and third portions 12 and 13 and extending onto the substrate 1 may be formed, instead, as an integral layer with the interconnecting portions 32 and 33, after mounting the body 21 on the lower body 11, 12, 13.

The metallizations 2 and 3 may be restricted to the top faces of the portions 12 and 13 and wire connections may be made to the metallizations 2 and 3 directly on the portions 12 and 13 without damage to the first detector elements. This is because the portions 12 and 13 are separate from the portion 11 comprising the detector elements 10. Furthermore in cases in which the portions 12 and 13 are sufficiently highly conductive without being metallized, these portions 12 and 13 of the lower body may themselves form the electrical connections from the upper electrodes 22 and 23 to the substrate 1.

The number of detector elements 10 and 20 in the linear arrays may be increased or decreased. Quite different configurations also may be used. Thus, for example instead of being linear, each array may be staggered or may be a two-dimensional matrix. The invention can even be used with a single detector element in each of the upper and lower bodies 21. In each case an appropriate redesign of the layout geometry and dimensions of the first, second and third portions 11, 12 and 13 and of their metallization connections to the substrate 1 will be necessary.

The detector elements of the upper and lower bodies may be photovoltaic p-n junction elements instead of photoconductive elements. In this case, a common detector element connection may be made at the bottom face of the body by a metallization and a localized area of electrically conductive epoxy. In this case it is possible to electrically connect part of the back face of the upper detector element body to the detector element part of the lower body so that, for example, the third common portion(s) of the divided lower body may be omitted in some detector element arrangements. Instead of using metallization layers extending over the side faces, all the electrical connections of both detector element bodies may be made by metallization columns at the bottom faces of both the bodies 21 and 11, 12, 13. However, in general it is easier to assembly the detector if all the electrode connections of a detector element are at the same, top face of the body.

A third detector element body may be mounted on the upper detector element body so as to form, for example, a 3-color detector. In this case the second-level body can be divided into separate portions by one or more gaps bridged by the third body and these separate portions may form one or more supporting steps for metallization connections to the detector element(s) of the third body. The lowermost bottom body can be divided into additional separate portions (i.e. in addition to first, second and third portions 11, 12, 13) so as to provide bottom-level supporting steps for the connections associated with the uppermost third body. Of course, a different layout geometry from that of FIG. 1 will be necessary.

The invention may also be employed in single-color detectors which comprise a thin upper body of the same band gap (and hence the same cutoff wavelength) as the thicker lower body. Such detectors can be operated in a manner similar to that described in the previously-mentioned U.S. Pat. No. 3,987,298 for resolving the wavelength of an unknown line source in a broad spectral range.

Although the invention is particularly advantageous for mitigating induced strain and stress problems in stacked detector element bodies of cadmium mercury telluride, detectors according to the invention may have at least one body of different infrared-sensitive semiconductor material. For example, other ternary intermetallic chalcogenides such as lead tin telluride, binary compounds such as lead sulphide or indium antimonide, or silicon can be used. The material and/or composition of the lower and upper bodies can be chosen so that the different detector elements 10 and 20 respond to infrared wavelengths in different spectral windows: 1 to 2 microns, 3 to 5 microns, 8 to 14 microns, and 16 to 22 microns.

Various materials may also be used for the substrate 1 depending on the type of detector required. In some detectors it may be desirable for the detector elements to face the substrate and receive the incident infrared radiation via the substrate, in which case the substrate must have appropriate transmission characteristics for the infrared radiation.

However in most detectors the infrared radiation will be incident at the upper or uppermost detector element body. Instead of sapphire, the substrate 1 may be, for example, alumina or beryllia. The substrate may alternatively be of silicon and may even comprise signal-processing circuitry. In this last case, the detector elements may be directly connected to the circuitry by their metallizations extending from the detector element bodies, so that intermediate wire connections are not required.

What I claim is:

1. An infrared radiation detector comprising:
    a substrate;
    a lower body of infrared-sensitive material mounted on the substrate, said lower body having at least one first detector element formed therein;
    an upper body of infrared-sensitive material mounted on the lower body, said upper body having at least one second detector element formed therein directly above the first detector element, said second detector element having detector characteristics different from those of the first detector element; and
    electrical connections to the first and second detector elements;
    characterized in that:
    the lower body is divided into at least first and second portions electrically insulated from each other and separated from each other by a gap;
    the upper body bridges the gap between the first and second portions of the lower body;
    the first portion of the lower body has the first detector element formed therein; and
    one of the electrical connections to the second detector element is formed on the second portion of the lower body.

2. An infrared radiation detector as claimed in claim 1, characterized in that:
    the second portion of the lower body has top and side faces; and
    the electrical connection comprises:
    the metallization on the top and side faces of the second portion of the lower body, said metallization also extending onto the substrate; and
    a metallization on the upper body extending onto the top face of the second portion of the lower body.

3. An infrared radiation detector as claimed in claim 2, characterized in that:
    the lower body is further divided into a third portion electrically insulated from the first portion and separated from the first portion by a gap:

the upper body also bridges the gap between the first and third portions of the lower body; and another electrical connection to the second detector element is formed on the third portion of the lower body.

4. An infrared radiation detector as claimed in claim 3, characterized in that:

the third portion of the lower body has top and side faces; and the electrical connection comprises:

a metallization on the top and side faces of the third portion of the lower body, said metallization also extending onto the substrate; and a metallization on the upper body extending onto the top face of the third portion of the lower body.

5. An infrared radiation detector as claimed in claim 3, characterized in that:

the lower body comprises an array of first detector elements; and the upper body comprises an array of second detector elements formed directly above the array of first detector elements.

6. An infrared radiation detector as claimed in claim 5, characterized in that:

the lower body comprises a separate second portion for each second detector element; and the lower body comprises a single third portion.

7. An infrared radiation detector as claimed in claim 6, characterized in that the second portions are arranged on one side of the array of first detector elements, and the third portion is arranged on another side of said array.

8. An infrared radiation detector as claimed in claim 7, characterized in that the lower body comprises an array of first portions, each first portion comprising a first detector element.

9. An infrared radiation as claimed in claim 1, characterized in that:

the infrared-sensitive material of the lower body has a cutoff wavelength which is higher than that of the upper body; and the first detector element senses long wavelength radiation transmitted by the upper body.

10. An infrared radiation detector as claimed in claim 1, characterized in that the upper and lower bodies are made of cadmium mercury telluride.

11. An infrared radiation detector as claimed in claim 1, characterized in that:

the lower body comprises an array of first detector elements; and the upper body comprises an array of second detector elements formed directly above the array of first detector elements.

12. An infrared radiation detector as claimed in claim 11, characterized in that the lower body comprises an array of first portions, each first portion comprising a first detector element.

* * * * *